United States Patent
Chen et al.

(10) Patent No.: US 11,871,534 B2
(45) Date of Patent: Jan. 9, 2024

(54) DISPLAY

(71) Applicant: AUO Display Plus Corporation, Hsinchu (TW)

(72) Inventors: Chia-Hung Chen, Hsinchu (TW); Chung-Kuan Ting, Hsinchu (TW); Hong-Ming Chen, Hsinchu (TW); Yung-Jen Chen, Hsinchu (TW)

(73) Assignee: AUO DISPLAY PLUS CORPORATION, Hsinchu (TW)

( * ) Notice: Subject to any disclaimer, the term of this patent is extended or adjusted under 35 U.S.C. 154(b) by 0 days.

(21) Appl. No.: 17/843,169

(22) Filed: Jun. 17, 2022

(65) Prior Publication Data

US 2023/0110660 A1    Apr. 13, 2023

(30) Foreign Application Priority Data

Oct. 7, 2021    (TW) .................. 110137419

(51) Int. Cl.
*H05K 7/18* (2006.01)
*H05K 7/14* (2006.01)

(52) U.S. Cl.
CPC ............ *H05K 7/18* (2013.01); *H05K 7/14* (2013.01)

(58) Field of Classification Search
None
See application file for complete search history.

(56) References Cited

U.S. PATENT DOCUMENTS

| 2009/0183819 A1 | 7/2009 | Matsuhira |
| 2012/0250289 A1 | 10/2012 | Kao et al. |

(Continued)

FOREIGN PATENT DOCUMENTS

| CN | 102809833 A | 12/2012 |
| CN | 204101843 U | 1/2015 |

(Continued)

OTHER PUBLICATIONS

Liu "The New Pinnacle of Ultra-Narrow Bezels! Sharp Aquos Crystal Hands-On Play", Aug. 25, 2014, https://www.sogi.com.tw/articles/%E8%B6%85%E7%AA%84%E9%82%8A%E6%A1%86%E7%9A%84%E6%96%B0%E5%B7%94%E5%B3%B0_Sharp_Aquos_Crystal%E5%8B%95%E6%89%8B%E7%8E%A9/6231237, Sogi Mobile Phone King.

*Primary Examiner* — James Wu
*Assistant Examiner* — Christopher L Augustin
(74) *Attorney, Agent, or Firm* — WPAT, P.C.

(57) ABSTRACT

A display includes an outer frame, a supporting frame, a display module, and a covering member. The supporting frame is accommodated in the outer frame. The display module is disposed on a supporting member of the supporting frame. The supporting member extends toward a display region of the display module from the supporting frame. On a first surface of the display module, a projection area of the supporting member and a projection area of an first optical film of the display module are partially overlapped with each other. A third surface of the covering member is closely attached to a second optical film of the display module. The covering member has an extension portion. The extension portion extends from a fourth surface opposite to the third surface toward a direction away from the third surface, and the extension portion is coplanar with the outer side surface of the outer frame.

2 Claims, 8 Drawing Sheets

(56) References Cited

U.S. PATENT DOCUMENTS

| | | | |
|---|---|---|---|
| 2014/0078719 A1* | 3/2014 | Jung | H05K 5/02 |
| | | | 361/679.01 |
| 2014/0204308 A1 | 7/2014 | Chung et al. | |
| 2014/0211507 A1* | 7/2014 | Notermans | G02B 6/0088 |
| | | | 362/97.1 |
| 2015/0138484 A1* | 5/2015 | Watanabe | G02F 1/133308 |
| | | | 349/58 |
| 2015/0168767 A1 | 6/2015 | Yonemura | |
| 2018/0088394 A1* | 3/2018 | Notoshi | G02F 1/133528 |
| 2022/0163838 A1* | 5/2022 | Lin | G02F 1/1347 |

FOREIGN PATENT DOCUMENTS

| | | |
|---|---|---|
| CN | 106547140 A | 3/2017 |
| CN | 107167963 A | 9/2017 |
| CN | 108181753 A | 6/2018 |
| JP | 2012093667 A | 5/2012 |
| KR | 20170041047 A * | 4/2017 |
| TW | M372500 U | 1/2010 |
| TW | 201310114 A | 3/2013 |
| TW | 201400939 A | 1/2014 |
| TW | I477856 B | 3/2015 |
| TW | D176651 S | 6/2016 |
| TW | I544241 B | 8/2016 |
| TW | I546602 B | 8/2016 |

\* cited by examiner

DISPLAY

CROSS-REFERENCE TO RELATED APPLICATION

This non-provisional application claims priority under 35 U.S.C. § 119(a) to Patent Application No. 110137419 filed in Taiwan, R.O.C. on Oct. 7, 2021, the entire contents of which are hereby incorporated by reference.

BACKGROUND

Technical Field

The instant disclosure relates to a display, in particular, to a display in which the display plane is flat without stepped structures.

Related Art

Regarding the display assembly techniques known to the inventor, the display panel is assembled by using adhesive materials or glue materials to attach on the module metal frame or by using plastic frame techniques. However, upon assembling the display panel on the module metal frame, a space is generated between the display panel and the module easily. As a result, not only the overall thickness of the display is increased, but also the touch sensitivity of the display is affected.

SUMMARY

In view of this, in one embodiment, a display is provided and comprises an outer frame, a supporting frame, a display module, and a covering member. The outer frame comprises an outer side surface and an inner side surface opposite to the outer side surface. The supporting frame has a supporting member, and the supporting frame is accommodated in the outer frame. The display module comprises a first surface, a second surface, a first optical film, and a second optical film. The first surface is opposite to the second surface. The display module is disposed on the supporting member. The supporting member extends toward a display region of the display module from the supporting frame. On the first surface, a projection area of the supporting member and a projection area of the first optical film are partially overlapped with each other. The covering member comprises a third surface and a fourth surface. The third surface is opposite to the fourth surface. The third surface of the covering member is closely attached to the second optical film of the display module. The covering member has an extension portion. The extension portion extends from the fourth surface toward a direction away from the third surface, and the extension portion is coplanar with the outer side surface of the outer frame.

In some embodiments, an extension surface of the extension portion and the outer side surface of the outer frame are arranged on the same plane, so that the extension surface of the extension portion and the outer side surface of the outer frame are coplanar with each other.

In some embodiments, a shape of a cross-sectional area of an end portion of the extension portion adjacent to the outer frame is a right angle, an inclined angle, or a round corner.

In some embodiments, the outer frame further comprises a first engaging member disposed on the inner side surface of the outer frame, the covering member further comprises a second engaging member disposed on the fourth surface of the covering member, and the first engaging member is assembled with the second engaging member.

In one embodiment of the instant disclosure, a display is provided and comprises a supporting frame, a display module, and a covering member. The supporting frame has a supporting member. The display module comprises a first surface, a second surface, a first optical film, and a second optical film. The first surface is opposite to the second surface. The first optical film is on the first surface, and the second optical film is on the second surface. The display module is disposed on the supporting member. The supporting member extends toward a display region of the display module from the supporting frame. On the first surface, a projection area of the supporting member and a projection area of the first optical film are partially overlapped with each other. The covering member comprises a third surface and a fourth surface. The third surface is opposite to the fourth surface. The third surface of the covering member is closely attached to the second optical film of the display module. The fourth surface of the covering member is a full-flat surface, and the third surface of the covering member encloses the supporting frame and the display module.

In some embodiments, the supporting frame further comprises a first engaging member, the covering member further comprises a second engaging member disposed on the third surface of the covering member, and the second engaging member of the covering member is assembled with the first engaging member of the supporting frame.

In one embodiment of the instant disclosure, a display is provided and comprises an outer frame, a supporting frame, a display module, and a covering member. The outer frame comprises an outer side surface and an inner side surface opposite to the outer side surface. The supporting frame has a supporting member, and the supporting member is accommodated in the outer frame. The display module comprises a first surface, a second surface, a first optical film, and a second optical film. The first surface is opposite to the second surface. The first optical film is on the first surface, and the second optical film is on the second surface. The display module is disposed on the supporting member, and the supporting member extends toward a display region of the display module from the supporting frame. On the first surface, a projection area of the supporting member and a projection area of the first optical film are partially overlapped with each other. The covering member comprises a third surface and a fourth surface. The third surface is opposite to the fourth surface. The third surface of the covering member is closely attached to the second optical film of the display module. The covering member has an extension portion. The extension portion is on the fourth surface and covers the outer side surface of outer frame at the same side of the fourth surface, so that a full-flat surface is formed from the fourth surface to the extension portion.

In some embodiments, the extension portion and the outer side surface are adhered with each other through a first adhesive layer, and the display module and the inner side surface are adhered with each other through a second adhesive layer.

Based on the above, in one embodiment, a display is provided and comprises an outer frame, a supporting frame, a display module, and a covering member. The extension portion of the covering member extends from the fourth surface toward a direction away from the third surface, and the extension portion is coplanar with the outer side surface of the outer frame. Therefore, no stepped structures are formed between the covering member and the outer frame, so that the covering member and the outer frame form a flat surface. Moreover, the third surface of the covering member is closely attached to the second optical film of the display module, so that no gaps are formed between the covering member and the second optical film of the display module. Therefore, the touch sensitivity of the display can be improved and the overall thickness of the display can be reduced. In one embodiment, a display is provided and comprises a supporting frame, a display module, and a covering member. The fourth surface of the covering member is a full-flat surface. The third surface of the covering member encloses the supporting frame and the display module, and the third surface of the covering member is closely attached to the second optical film of the display module. Therefore, the touch sensitivity of the display can be improved and the overall thickness of the display can be reduced. Moreover, in one embodiment, a display is provided. The extension portion extending from the covering member covers the outer frame, so that a continuous and complete full-flat surface is formed from the fourth surface to the extension portion of the covering member, thereby increasing aesthetic feelings of the display.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
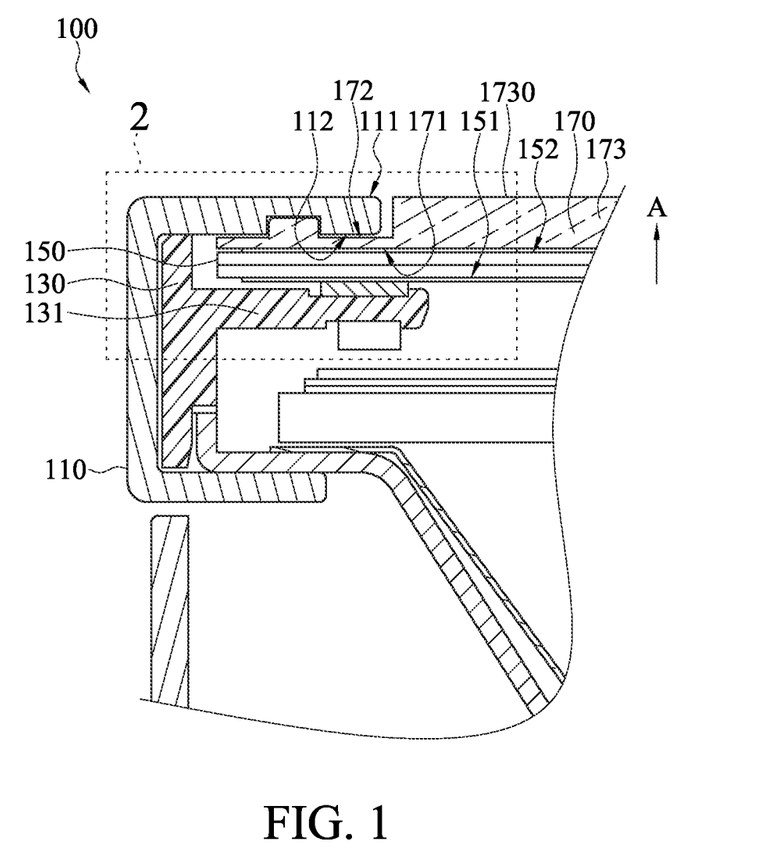
FIG. 1 illustrates a partial cross-sectional view of a display according to a first embodiment of the instant disclosure.
Figure 2:
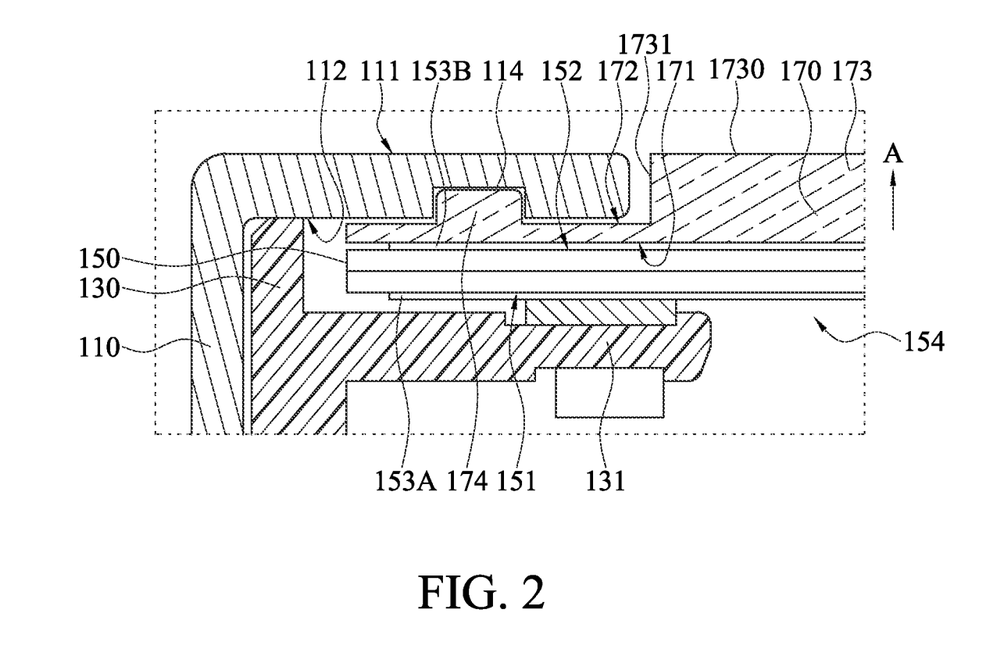
FIG. 2 illustrates an enlarged partial view of FIG. 1.

Please refer to FIG. 1 and FIG. 2. FIG. 1 illustrates a FIG. 1 illustrates a partial cross-sectional view of a display according to a first embodiment of the instant disclosure. FIG. 2 illustrates an enlarged partial view of FIG. 1. In this embodiment, a display 100 comprises an outer frame 110, a supporting frame 130, a display module 150, and a covering member 170.

As shown in FIG. 1, the outer frame 110 comprises an outer side surface 111 and an inner side surface 112 opposite to the outer side surface 111. The supporting frame 130 has a supporting member 131, and the supporting frame 130 is accommodated in the outer frame 110. In the first embodiment, the supporting frame 130 is at one side of the inner side surface 112 of the outer frame 110 and is enclosed by the outer frame 110.

As shown in FIG. 1 and FIG. 2, the display module 150 comprises a first surface 151, a second surface 152, a first optical film 153A, and a second optical film 153B. The first surface 151 is opposite to the second surface 152. The first optical film 153A is on the first surface 151, the second optical film 153B is on the second surface 152, and the display module 150 is disposed on the supporting member 131, so that the display module 150 can be positioned. Moreover, the supporting member 131 extends toward a display region 154 of the display module 150 from the supporting frame 130. In other words, in this embodiment, the supporting member 131 is at the other surface of the first optical film 153A, and a projection area of the supporting member 131 on the first surface 151 and a projection area of the first optical film 153A on the first surface 151 are partially overlapped with each other. In the first embodiment, the first optical film 153A and the second optical film 153B may be optical films such as polarizers or prisms.

As shown in FIG. 1 and FIG. 2, the covering member 170 comprises a third surface 171 and a fourth surface 172. The third surface 171 is opposite to the fourth surface 172. The third surface 171 of the covering member 170 is closely attached to the second optical film 153B of the display module 150. In the first embodiment, the covering member 170 is assembled with the outer frame 110, and the third surface 171 is closely attached to the second optical film 153B of the display module 150, so that no gaps are formed between the covering member 170 and the second optical film 153B of the display module 150. The detail assembly structure of the covering member 170 and the outer frame 110 will be described in the following paragraphs. An extension portion 173 of the covering member 170 extends from the fourth surface 172 toward a direction away from the third surface 171, and the extension portion 173 is coplanar with the outer side surface 111 of the outer frame 110. As shown in FIG. 2, the extension portion 173 extends from the fourth surface 172 toward the light emitting direction A of the display module 150, and the extension portion 173 is approximately flushed with the outer side surface 111 of the outer frame 110. In other words, in this embodiment, an extension surface 1730 of the extension portion 173 and the outer side surface 111 of the outer frame are arranged on the same plane, so that the extension surface 1730 and the outer side surface 111 are coplanar with each other.

Specifically, in the display 100 of this embodiment, the extension portion 173 of the covering member 170 extends from the fourth surface 172 toward the direction away from the third surface 171, and the extension portion 173 and the outer side surface 111 of the outer frame 110 are coplanar with each other, so that no stepped structures are formed between the extension portion 173 of the covering member 170 and the outer frame 110, and a flat surface can be formed. Moreover, the third surface 171 of the covering member 170 is closely attached to the second optical film 153B of the display module 150, so that no gaps are formed between the covering member 170 and the second optical film 153B of the display module 150. Therefore, the touch sensitivity of the display can be improved and the overall thickness of the display can be reduced.

Figure 3A:
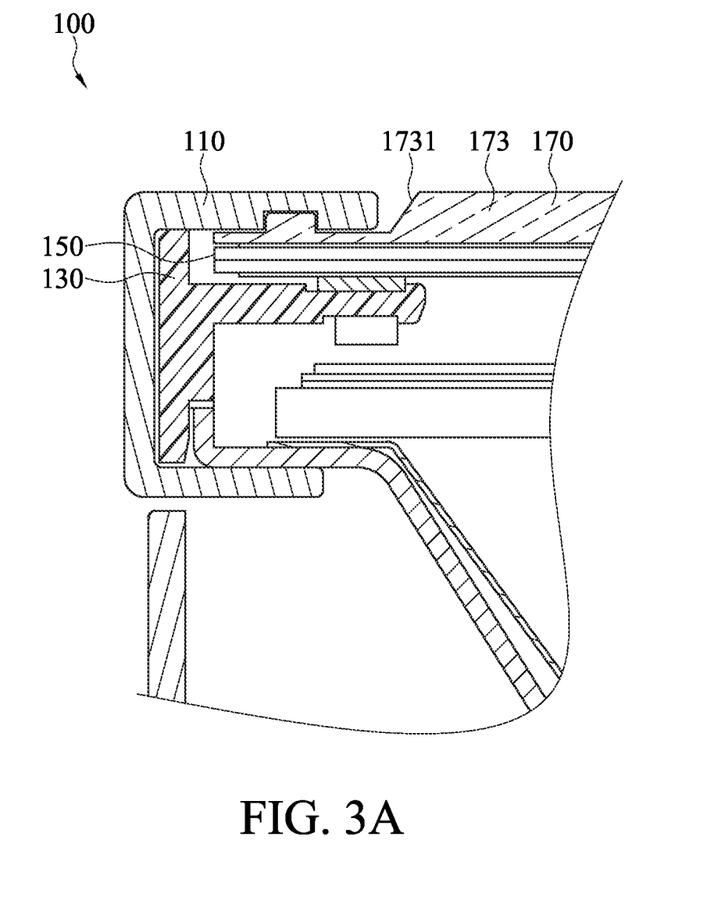
FIG. 3A illustrates a partial cross-sectional view (1) of the display of the first embodiment display, where the covering member is of another implementation.
Figure 3B:
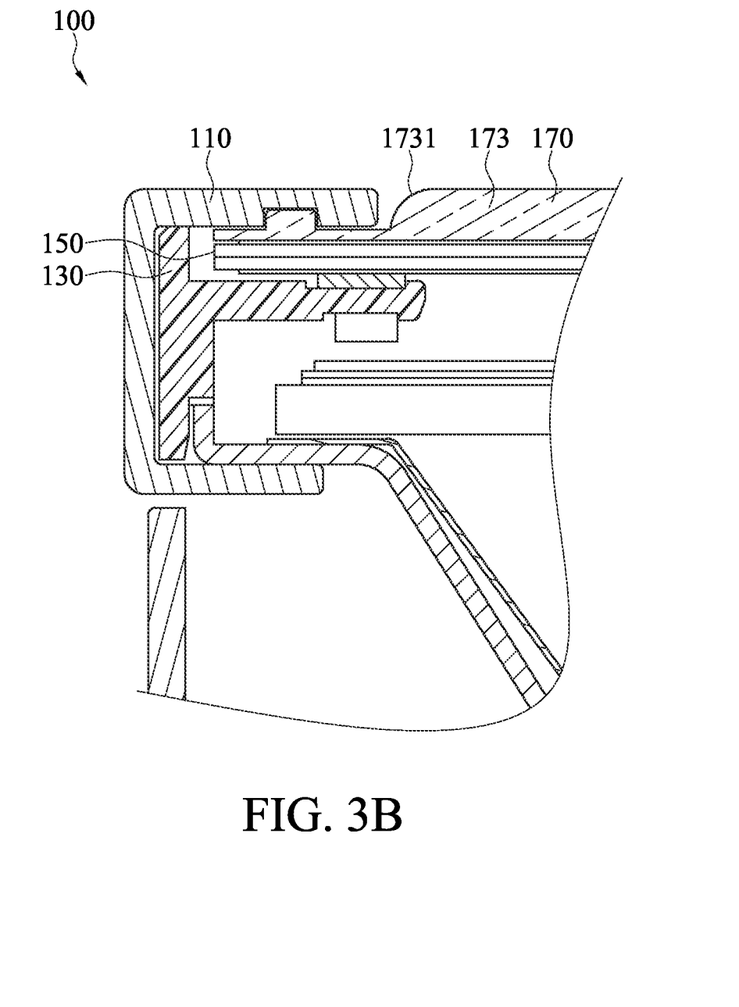
FIG. 3B illustrates a partial cross-sectional view (2) of the display of the first embodiment display, where the covering member is of yet another implementation.

Please refer to FIG. 3A and FIG. 3B. FIG. 3A illustrates a partial cross-sectional view (1) of the display of the first embodiment display, where the covering member is of another implementation. FIG. 3B illustrates a partial cross-sectional view (2) of the display of the first embodiment display, where the covering member is of yet another implementation. In some embodiments, a shape of a cross-sectional area of an end portion of the extension portion 173 adjacent to the outer frame 110 is a right angle, an inclined angle, or a round corner. Specifically, in some embodiments, the extension portion 173 extends from the fourth surface 172 of the covering member 170, and the cross-sectional areas of the two end portions of the extension portion 173 adjacent to the outer frame 110 along the extension direction have a shape, and one of the end portions of the extension portion 173 is described for illustrative purposes. As shown in FIG. 2, in the first embodiment, the shape of the cross-sectional area of the end portion 1731 of the extension portion 173 is a right angle. As shown in FIG. 3A, in another implementation of the first embodiment, the shape of the cross-sectional area of the end portion 1731 of the extension portion 173 is an inclined angle. As shown in FIG. 3B, in yet another implementation of the first embodiment, the shape of the cross-sectional area of the end portion 1731 of the extension portion 173 is a round corner. In other words, in some embodiments, the shape of the cross-sectional area of the end portion 1731 of the extension portion 173 may be for example a right angle, so that the covering member 170 has a flat plane, and the display 100 can have an integrated appearance. Alternatively, in some embodiments, the shape of the cross-sectional area of the end portion 1731 of the extension portion 173 may be an inclined angle or a round corner, so that the peripheral portion of the display 100 can provide a better field of view. Moreover, the round corner configuration allows the peripheral portion of the display 100 to provide a curved surface effect to enhance the aesthetic feelings of the display 100. Moreover, the inclined angle configuration allows the viewing angle of the display 100 to be increased owing to the inclined-angle projection. However, it is understood that, the shape of the cross-sectional area of the end portion 1731 of the extension portion 173 is not limited thereto. The cross-sectional area of the end portion 1731 of the extension portion 173 may be of other shapes.

Figure 4:
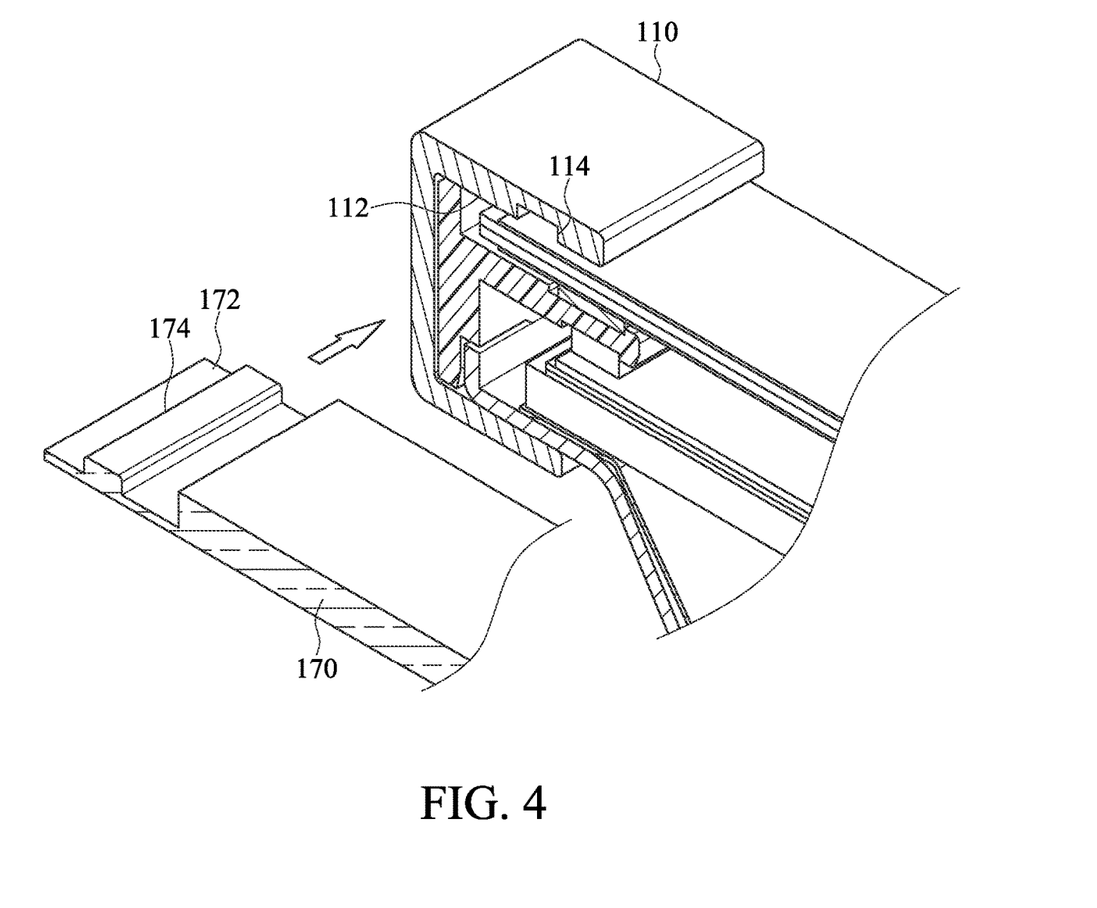
FIG. 4 illustrates a schematic sectional view of the display according to the first embodiment of the instant disclosure.

Please refer to FIG. 4 as well as FIG. 1 and FIG. 2. FIG. 4 illustrates a schematic sectional view of the display according to the first embodiment of the instant disclosure. Regarding the assembly of the covering member 170 and the outer frame 110, in the first embodiment, the outer frame 110 further comprises a first engaging member 114 disposed on the inner side surface 112 of the outer frame 110. The covering member 170 further comprises a second engaging member 174 disposed on the fourth surface 172 of the covering member 170. The second engaging member 174 of the covering member 170 is assembled with the first engaging member 114 of the outer frame 110. Specifically, in this embodiment, as shown in FIG. 1, FIG. 2, and FIG. 4, the inner side surface 1112 of the outer frame 110 comprises a first engaging member 114 having a female structure, and the fourth surface 172 of the covering member 170 comprises a second engaging member 174 having a male structure. Therefore, the second engaging member 174 is engaged with the first engaging member 114, so that the covering member 170 is assembled on the outer frame 110. In this embodiment, the covering member 170 is assembled with the inner side surface 112 of the outer frame 110, so that the extension portion 173 of the covering member 170 and the outer side surface 111 of the outer frame 110 are coplanar with each other, thereby further reducing the overall thickness of the display 100. In the first embodiment, the first engaging member 114 may be served as a male structure, the second engaging member 174 may be served as a female structure, and the shape of the first engaging member 114 corresponds to the shape of the second engaging member 174. For example, the shape of the cross-sectional area of the first engaging member 114 is a circle, a triangle, a rectangle, or a polygon, and the shape of the cross-sectional area of the second engaging member 174 corresponds to the shape of the first engaging member 114, so that the first engaging member 114 and the second engaging member 174 can be engaged with each other. As shown in FIG. 1 and FIG. 2, in the first embodiment, the cross-sectional area of the first engaging member 114 and the cross-sectional area of the second engaging member 174 are rectangular-shaped, but embodiments are not limited thereto.

Figure 5:
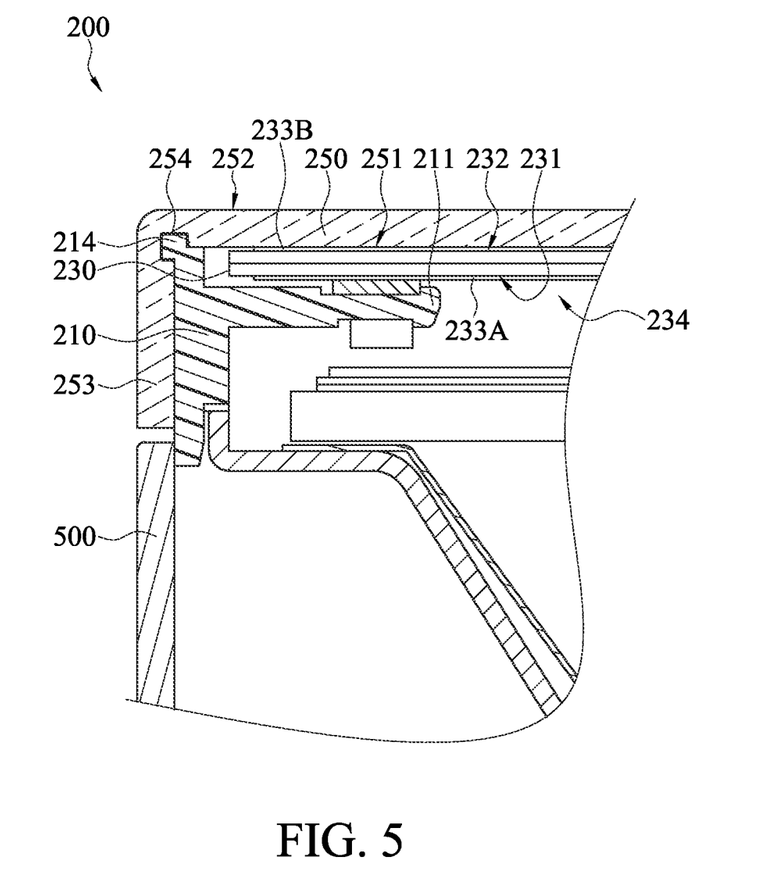
FIG. 5 illustrates a partial cross-sectional view of a display according to a second embodiment of the instant disclosure.

Please refer to FIG. 5. FIG. 5 illustrates a partial cross-sectional view of a display according to a second embodiment of the instant disclosure. The structures of the second embodiment same as the first embodiment are not iterated again. In the second embodiment, the display 200 comprises a supporting frame 210, a display module 230, and a covering member 250. The supporting frame 210 has a supporting member 211. The display module 230 comprises a first surface 231, a second surface 232, a first optical film 233A, and a second optical film 233B. The first surface 231 is opposite to the second surface 232. The first optical film 233A is on the first surface 231, the second optical film 233B is on the second surface 232, and the display module 150 is disposed on the supporting member 211, so that the display module 230 can be positioned. Moreover, the supporting member 211 extends toward a display region 234 of the display module 230 from the supporting frame 120. In other words, in this embodiment, the supporting member, and a projection area of the supporting member 211 on the first surface 231 and a projection area of the first optical film 233A on the first surface 231 are partially overlapped with each other. The covering member 250 comprises a third surface 251 and a fourth surface 152. The third surface 251 is opposite to the fourth surface 252. The third surface 251 of the covering member 250 is closely attached to the second optical film 233B of the display module 230. The fourth surface 252 of the covering member 250 is a full-flat surface, and the third surface 251 encloses the supporting frame 210 and the display module 230. In the second embodiment, the fourth surface 252 is a flat and complete surface. In other words, the fourth surface is a full-flat surface.

Specifically, in this embodiment, the display 200 does not have the outer frame. The covering member 250 is provided to replace the outer frame, and extension frames 253 extends from two ends of the covering member 250. In this embodiment, one end of the covering member 250 is described for illustrative purposes. As shown in FIG. 5, the fourth surface 252 is a flat and complete surface, the supporting frame 210 and the display module 230 are enclosed by the third surface 251 of the covering member 250, and the extension frames 253 of the covering member 250 also extends to and encloses the supporting frame 210 and the display module 230. Therefore, the supporting frame 210 and the display module 230 are not exposed, and the outer surface of the extension frame 253 and the outer surface of the chassis 500 are also arranged on the same plane. Therefore, the appearance of the display 200 provides a full-flat surface, and the touch sensitivity of the display can be improved and the overall thickness of the display can be reduced.

Figure 6:
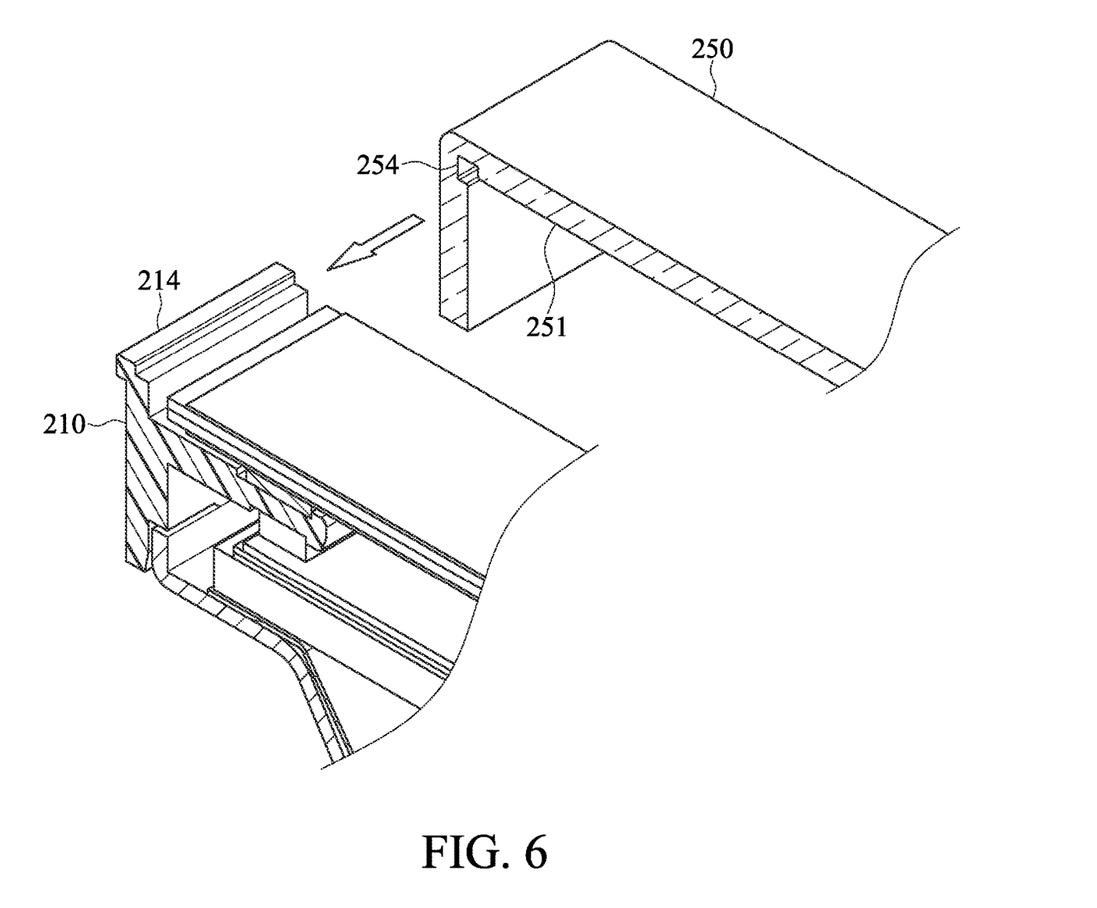
FIG. 6 illustrates a schematic sectional view of the display according to the second embodiment of the instant disclosure.

Please refer to FIG. 6. FIG. 6 illustrates a schematic sectional view of the display according to the second embodiment of the instant disclosure. In the second embodiment, the supporting frame 210 further comprises a first engaging member 214. The covering member 250 further comprises a second engaging member 254 disposed on the third surface 251 of the covering member 250. The second engaging member 254 of the covering member 250 is assembled with the first engaging member 214 of the supporting frame 210. Specifically, in this embodiment, as shown in FIG. 5 and FIG. 6, the supporting frame 210 comprises a first engaging member 214 having a male structure, and the third surface 251 of the covering member 250 comprises a second engaging member 254 having a female structure. Therefore, the second engaging member 254 is engaged with the first engaging member 214, so that the covering member 250 is assembled on the supporting frame 210. In this embodiment, the second engaging member 254 is engaged with the first engaging member 214, so that the covering member 250 is assembled on the supporting frame 210. Mover, the supporting frame 210 is assembled on the third surface 251 of the covering member 250, so that the covering member 250 encloses the supporting frame 210 and the display module. Therefore, the fourth surface 252 of the covering member 250 forms a full-flat surface, and the overall thickness of the display 200 can be reduced.

Figure 7:
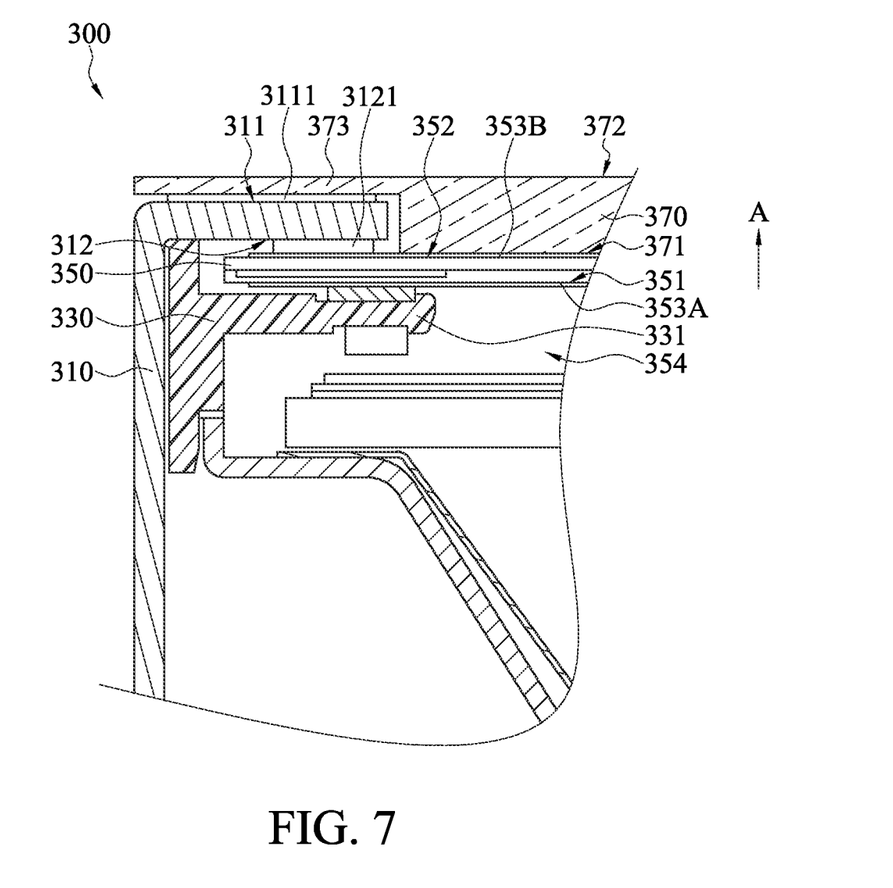
FIG. 7 illustrates a partial cross-sectional view of a display according to a third embodiment of the instant disclosure.

Please refer to FIG. 7. FIG. 7 illustrates a partial cross-sectional view of a display according to a third embodiment of the instant disclosure. In the third embodiment, the display 300 comprises an outer frame 310, a supporting frame 330, a display module 350, and a covering member 370. The outer frame 310 comprises an outer side surface 311 and an inner side surface 312 opposite to the outer side surface 311. The supporting frame 330 has a supporting member 331. The supporting frame 330 is at one side of the inner side surface 312 of the outer frame 310 and is enclosed by the outer frame 310. The display module 350 comprises a first surface 351, a second surface 352, a first optical film 353A, and a second optical film 353B. The first surface 351 is opposite to the second surface 352. The first optical film 353A is on the first surface 351, the second optical film 353B is on the second surface 352, and the display module 350 is disposed on the supporting member 331, so that the display module 350 can be positioned.

Moreover, the supporting member 331 extends toward a display region 354 of the display module 350 from the supporting frame 330. In other words, in this embodiment, the supporting member 331 is at one surface of the first optical film 353A away from the first surface 351, and a projection area of the supporting member 331 on the first surface 351 and a projection area of the first optical film 353A on the first surface 351 are partially overlapped with each other. As shown in FIG. 7, the covering member 370 comprises a third surface 371 and a fourth surface 372. The third surface 371 is opposite to the fourth surface 372. The third surface 371 and the fourth surface 372 are arranged parallel to each other in the light emitting direction A. The third surface 371 is on the inner side of the outer frame 310, and the fourth surface 372 is on the outer side of the outer frame 310. The third surface 371 of the covering member 370 is closely attached to the second optical film 353B of the display module 350. The covering member 370 is assembled with the outer frame 310, and the third surface 371 is closely attached to the second optical film 353B of the display module 350, so that no gaps are formed between the covering member 370 and the second optical film 353B of the display module 350. In FIG. 7, for illustrative purposes, only half of the display 300 is illustrated. As shown in FIG. 7, the covering member 370 comprises an extension portion 373. The extension portion 373 is on the fourth surface 372 of the covering member 370 and protrudes outwardly from the covering member 370 (for example, as shown in FIG. 7, the extension portion 373 protrudes leftwardly. The extension portion 373 is closely attached to the outer side surface 311 of the outer frame 310 and encloses the outer frame 310, so that a full-flat surface is formed from the fourth surface 372 to the extension portion 373.

In the third embodiment, as shown in FIG. 7, the extension portion 373 and the outer side surface 311 of the outer frame 310 are adhered with each other through a first adhesive layer 3111, and the display module 350 and the inner side surface 312 of the outer frame 310 are adhered with each other through a second adhesive layer 3121.

Based on the above, in the first embodiment, a display 100 is provided and comprises an outer frame 110, a supporting frame 130, a display module 150, and a covering member 170. The extension portion 173 of the covering member 170 extends from the fourth surface 172 toward a direction away from the third surface 171, and the extension portion 173 is coplanar with the outer side surface 111 of the outer frame 110. Therefore, no stepped structures are formed between the covering member 170 and the outer frame 119, so that the covering member 1770 and the outer frame 110 form a flat surface. Moreover, the third surface 171 of the covering member 170 is closely attached to the second optical film 153B of the display module150, so that no gaps are formed between the covering member 170 and the second optical film 153B of the display module 150. Therefore, the touch sensitivity of the display 100 can be improved and the overall thickness of the display 100 can be reduced. In the second embodiment, a display 200 is provided and comprises a supporting frame 210, a display module 230, and a covering member 250. The fourth surface 252 of the covering member 250 is a full-flat surface. The third surface 251 of the covering member 250 encloses the supporting frame 210 and the display module 230, and the third surface 251 of the covering member 250 is closely attached to the second optical film 233B of the display module 230. Therefore, the touch sensitivity of the display 200 can be improved and the overall thickness of the display 200 can be reduced. Moreover, in the third embodiment, a display 300 is provided. The extension portion 373 extending from the covering member 370 covers the outer frame 310, so that a continuous and complete full-flat surface is formed from the fourth surface 372 to the extension portion 373 of the covering member 370, thereby increasing aesthetic feelings of the display 300.

What is claimed is:
1. A display comprising:
an outer frame comprising an outer side surface and an inner side surface opposite to the outer side surface;
a supporting frame having a supporting member, wherein the supporting frame is accommodated in the outer frame;
a display module comprising a first surface, a second surface, a first optical film, and a second optical film, wherein the first surface is opposite to the second surface, the first optical film is on the first surface, and the second optical film is on the second surface; the display module is disposed on the supporting member; the supporting member extends toward a display region of the display module from the supporting frame; on the first surface, a projection area of the supporting member and a projection area of the first optical film are partially overlapped with each other; and
a covering member comprising a third surface and a fourth surface, wherein the third surface is opposite to the fourth surface, the third surface and fourth surface are arranged parallel to each other in a light emitting direction, and the third surface is on the inner side of the outer frame, and the fourth surface is on the outer side of the outer frame; and the third surface of the covering member is closely attached to the second optical film of the display module; the covering member has an extension portion, the extension portion is on the fourth surface and covers the outer side surface of the outer frame at the same side of the fourth surface, so that a full-flat surface is formed from the fourth surface to the extension portion.

2. The display according to claim 1, wherein the extension portion and the outer side surface are adhered with each other through a first adhesive layer, and the display module and the inner side surface are adhered with each other through a second adhesive layer.

* * * * *